US009389279B2

(12) United States Patent
Bober

(10) Patent No.: US 9,389,279 B2
(45) Date of Patent: Jul. 12, 2016

(54) BATTERY CELL ASSEMBLY WITH A THIN PROFILE SENSOR

(71) Applicant: LG Chem, Ltd., Seoul (KR)

(72) Inventor: Greg Bober, Saint Clair Shores, MI (US)

(73) Assignee: LG Chem, Ltd., Seoul (KR)

( * ) Notice: Subject to any disclaimer, the term of this patent is extended or adjusted under 35 U.S.C. 154(b) by 477 days.

(21) Appl. No.: 14/044,364

(22) Filed: Oct. 2, 2013

(65) Prior Publication Data
US 2015/0094970 A1 Apr. 2, 2015

(51) Int. Cl.
*G01R 31/36* (2006.01)
*H01M 10/48* (2006.01)
*H01M 10/42* (2006.01)
*H01M 10/615* (2014.01)
*H01M 10/655* (2014.01)

(52) U.S. Cl.
CPC ......... *G01R 31/3655* (2013.01); *H01M 10/425* (2013.01); *H01M 10/48* (2013.01); *H01M 10/615* (2015.04); *H01M 10/655* (2015.04); *G01R 31/3624* (2013.01); *G01R 31/3662* (2013.01)

(58) Field of Classification Search
CPC ........... G01R 31/3655; G01R 31/3624; G01R 31/3662; H01M 10/425; H01M 10/48; H01M 10/655; H01M 10/615
USPC ....... 702/63; 324/426; 713/340; 429/50, 176, 429/62; 174/260; 219/217
See application file for complete search history.

(56) References Cited

U.S. PATENT DOCUMENTS 6,469,512 B2 * 10/2002 Singh .................. G01R 31/3662
324/426
8,264,202 B2    9/2012 Sahu et al.
8,341,449 B2 * 12/2012 Daniel ..................... H04Q 9/00
713/340

(Continued)

FOREIGN PATENT DOCUMENTS

DK    EP0795206    * 4/1999
JP    2013123357      1/2013

(Continued)

OTHER PUBLICATIONS

U.S. Appl. No. 14/019,577 filed on Sep. 6, 2013 entitled Battery Cell Assembly.

*Primary Examiner* — Mohamed Charioui
*Assistant Examiner* — Carlos A Martinez
(74) *Attorney, Agent, or Firm* — Buckert Patent & Trademark Law Firm, PC; John F. Buckert

(57) ABSTRACT

A battery cell assembly having a battery cell and a thin profile sensor is provided. The battery cell has a housing and first and second electrical terminals. The thin profile sensor has a flexible plastic sheet, and a microprocessor, a sensing circuit, and a heat generating circuit coupled to the flexible plastic sheet. The flexible plastic sheet is coupled to the battery cell. The microprocessor determines a first voltage value representing an open circuit voltage, and a second voltage value of the battery cell when the battery cell is supplying electrical current through the heat generating circuit. The microprocessor determines a current value when the battery cell is supplying the electrical current through the heat generating circuit, and determines an internal resistance value based on the first voltage value, the second voltage value, and the current value.

18 Claims, 13 Drawing Sheets

(56) References Cited

U.S. PATENT DOCUMENTS

| | | | |
|---|---|---|---|
| 8,449,998 B2* | 5/2013 | Koetting | H01M 10/48 429/50 |
| 8,489,264 B2 | 7/2013 | Morita et al. | |
| 8,519,674 B2 | 8/2013 | Anderson et al. | |
| 8,519,716 B2 | 8/2013 | Kurata | |
| 2005/0103775 A1 | 5/2005 | Nelson et al. | |
| 2006/0289421 A1* | 12/2006 | Axinte | A47C 4/52 219/217 |
| 2007/0111091 A1* | 5/2007 | Hiratsuka | H01M 2/0275 429/176 |
| 2008/0254348 A1 | 10/2008 | Hatta et al. | |
| 2010/0104929 A1 | 4/2010 | Gutsch | |
| 2012/0242144 A1 | 9/2012 | Chorian et al. | |
| 2013/0004811 A1* | 1/2013 | Banerjee | G01K 7/16 429/62 |
| 2014/0014403 A1* | 1/2014 | Miller | H05K 1/0281 174/260 |
| 2015/0072190 A1 | 3/2015 | Bober | |
| 2015/0094970 A1 | 4/2015 | Bober | |

FOREIGN PATENT DOCUMENTS

| | | |
|---|---|---|
| KR | 101224704 | 5/2011 |
| KR | 20130004042 A | 1/2013 |

* cited by examiner

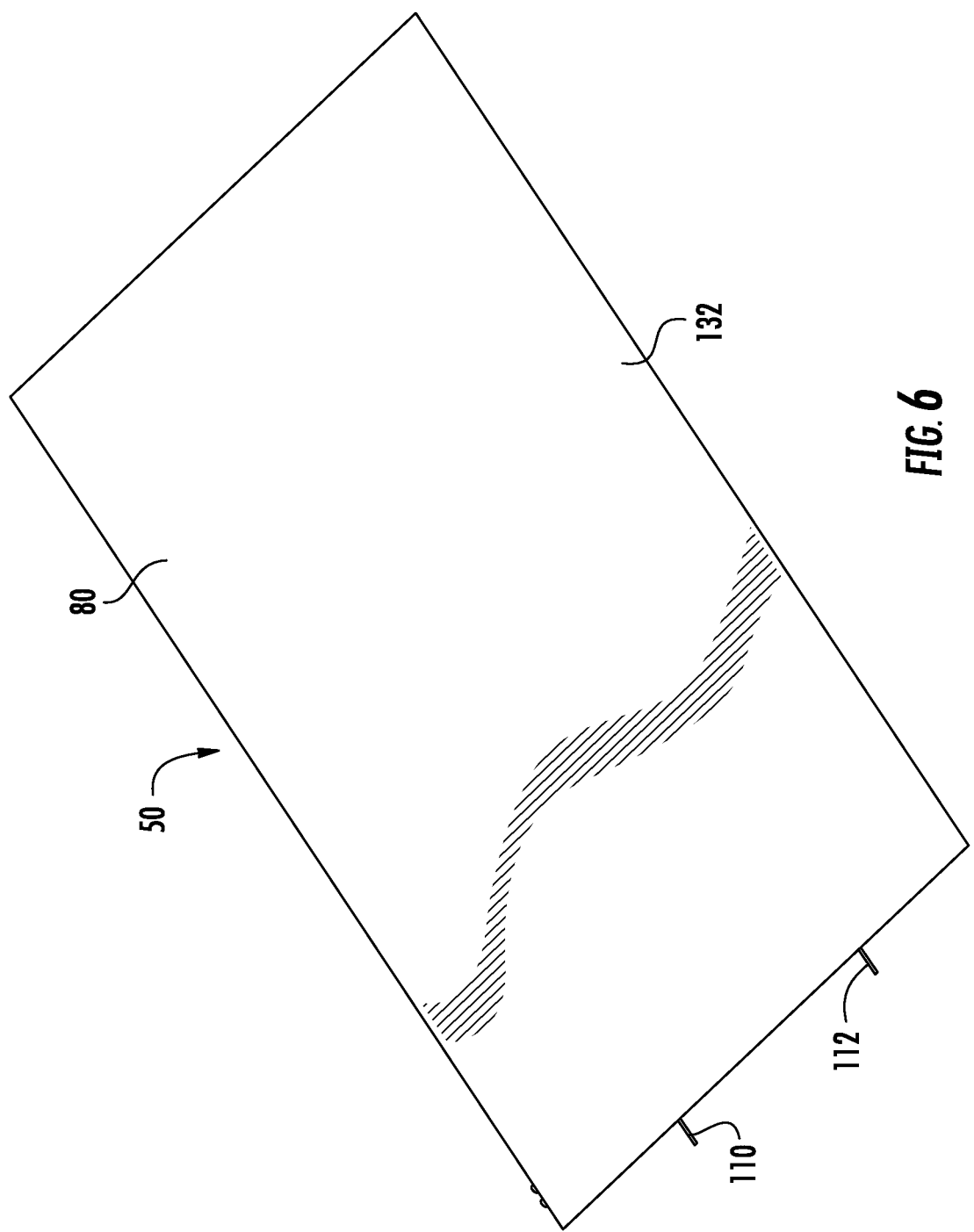

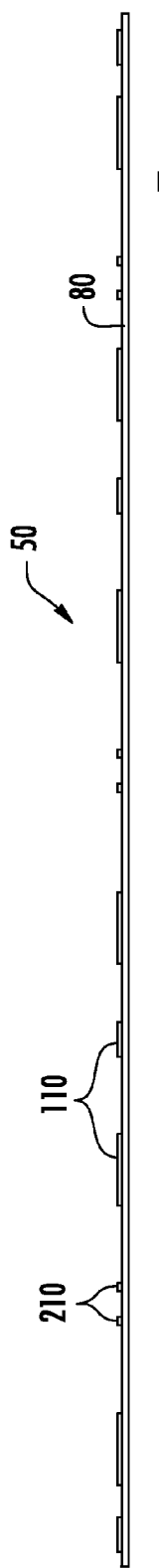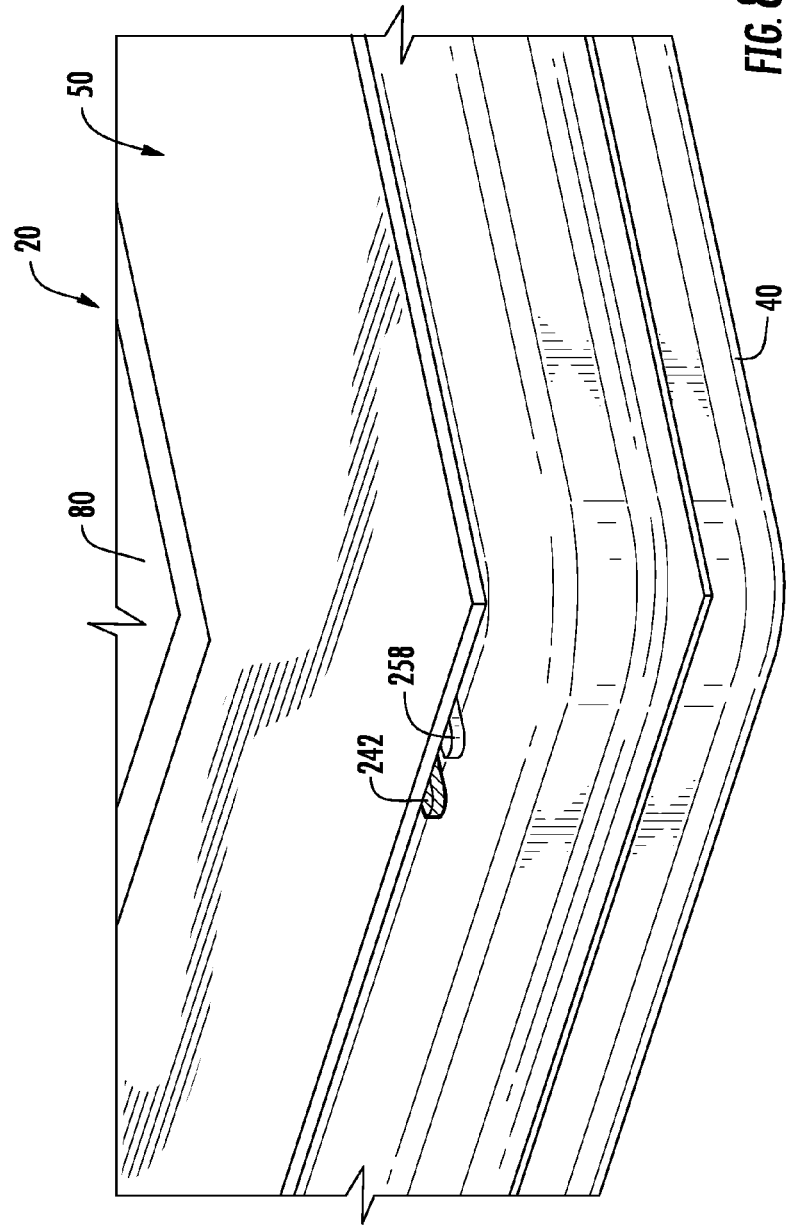

|        | SOC 1 | SOC 2 | SOC 3 |
|--------|-------|-------|-------|
| TEMP 1 | IR 1  | IR 4  | IR 7  |
| TEMP 2 | IR 2  | IR 5  | IR 8  |
| TEMP 3 | IR 3  | IR 6  | IR 9  |

BATTERY CELL ASSEMBLY WITH A THIN PROFILE SENSOR

BACKGROUND

The inventor herein has recognized a need for a battery cell assembly that utilizes a thin profile sensor attached to an exterior surface of a battery cell for determining an internal resistance value and a state-of-charge value of the battery cell.

SUMMARY

A battery cell assembly in accordance with an exemplary embodiment is provided. The battery cell assembly includes a battery cell having a housing and first and second electrical terminals extending from the housing. The battery cell assembly further includes a thin profile sensor having a flexible plastic sheet, a microprocessor, a sensing circuit, and a heat generating circuit. The microprocessor is operably coupled to the sensing circuit and the heat generating circuit. The microprocessor, the sensing circuit, and the heat generating circuit are coupled to the flexible plastic sheet. The flexible plastic sheet is coupled to an exterior surface of the housing of the battery cell. The microprocessor is programmed to determine a first voltage value corresponding to an open circuit voltage of the battery cell between the first and second electrical terminals. The microprocessor is further programmed to determine a second voltage value corresponding to a first voltage of the battery cell between the first and second electrical terminals when the battery cell is supplying electrical current through the heat generating circuit. The microprocessor is further programmed to determine a current value corresponding to an electrical current level flowing through the battery cell when the battery cell is supplying the electrical current through the heat generating circuit. The microprocessor is further programmed to determine an internal resistance value corresponding to an internal resistance level of the battery cell based on the first voltage value, the second voltage value, and the current value. The microprocessor is further programmed to store the internal resistance value in a memory device.

BRIEF DESCRIPTION OF THE DRAWINGS

FIG. 6 is a schematic of a second side of the thin profile sensor of FIG. 3;

FIG. 7 is a cross-sectional schematic of the thin profile sensor of FIG. 3 along lines 7-7;

FIG. 8 is an enlarged schematic of a portion of the battery cell assembly of FIG. 1;

DETAILED DESCRIPTION

Figure 1:
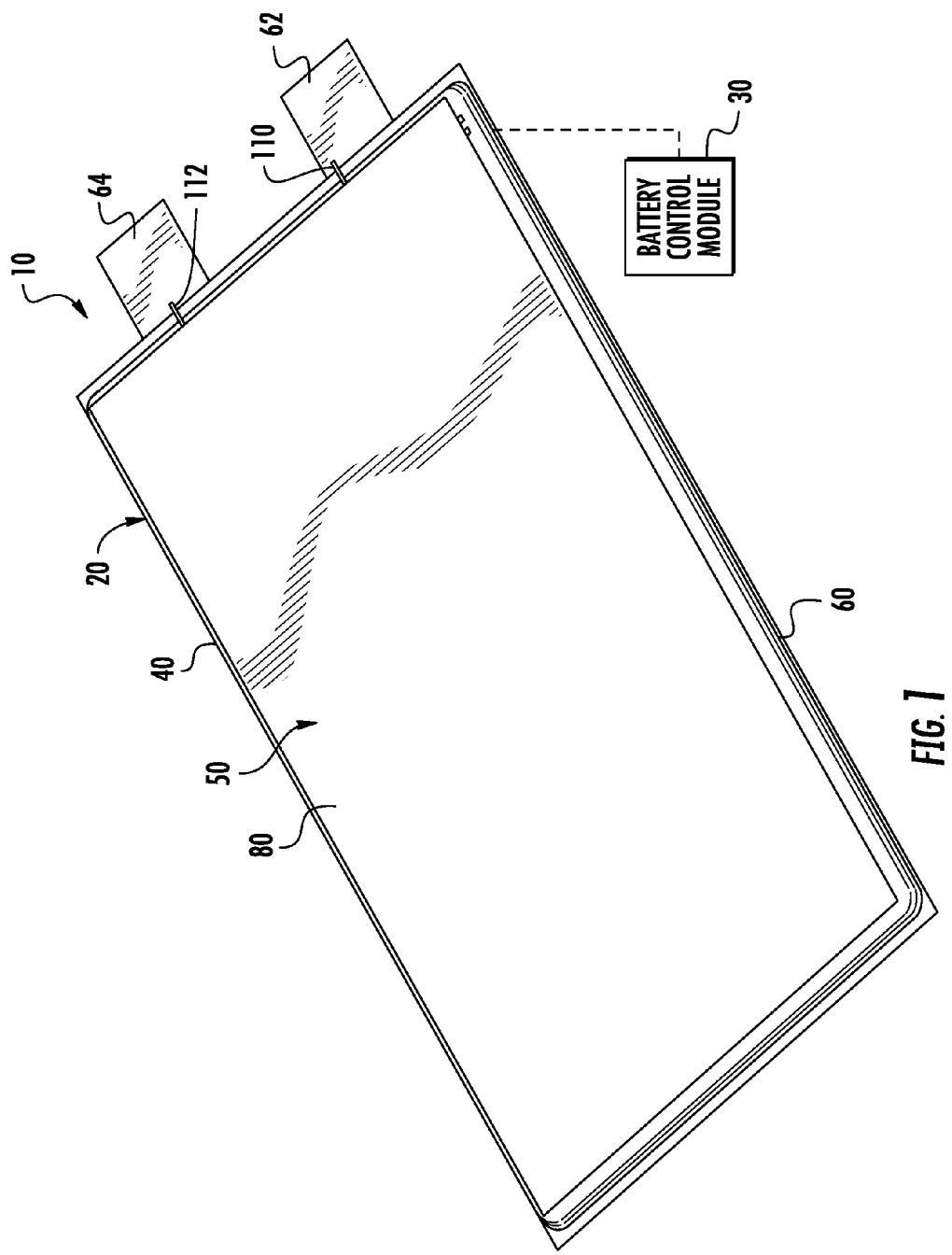
FIG. 1 is a schematic of a battery system having a battery cell assembly in accordance with an exemplary embodiment.
Figure 2:
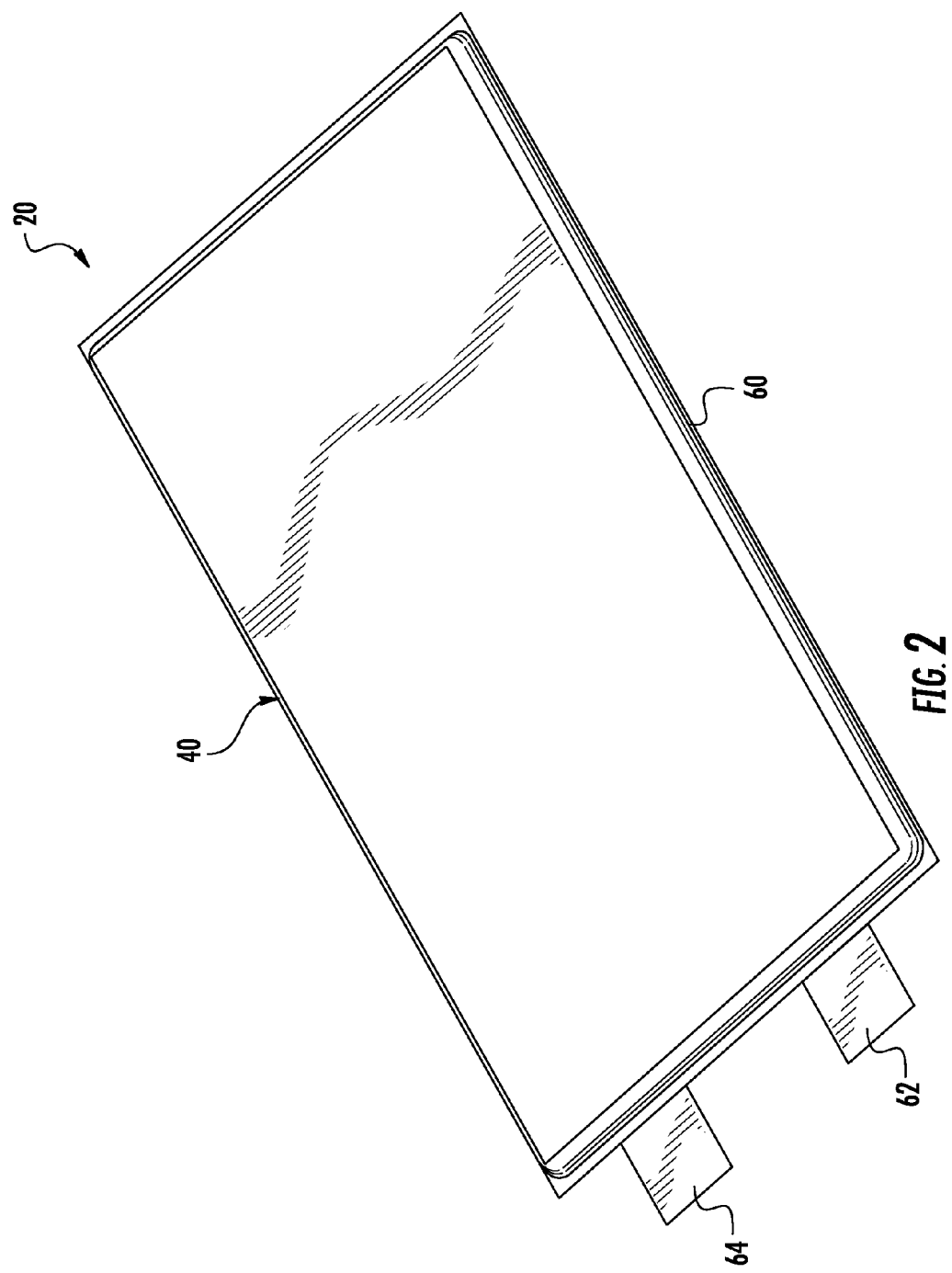
FIG. 2 is a schematic of the battery cell assembly of FIG. 1.

Referring to FIGS. 1 and 2, a battery system 10 having a battery cell assembly 20 in accordance with an exemplary embodiment, and a battery control module 30 is provided.

Referring to FIGS. 1, 3, 5 and 7, the battery cell assembly 20 includes a battery cell 40 and a thin profile sensor 50. An advantage of the battery cell assembly 20 is that the thin profile sensor 50 is coupled directly to an exterior surface of a battery cell 40 and determines an internal resistance value and a state-of-charge value of the battery cell 40, and controls a state-of-charge of the battery cell 40 based on the state-of-charge value.

For purposes of understanding, the term "trace" means a thin electrically conductive member herein.

Referring to FIGS. 1 and 2, the battery cell 40 has a housing 60 and electrical terminals 62, 64 extending from the housing 60. The housing 60 is configured to enclose an active element that generates a voltage between the electrical terminals 62, 64. In an exemplary embodiment, the battery cell 40 is a lithium-ion pouch-type battery cell. Further, in the exemplary embodiment, the housing 60 is substantially rectangular-shaped and has an outer surface 66 (shown in FIG. 9). In an alternative embodiment, the battery cell 40 could be another type of battery cell such as a nickel-metal-hydride battery cell, or a nickel-cadmium battery cell for example. Further, in an alternative embodiment, the housing of the battery cell 40 could have another shape such as a cylindrical shape for example. Still further, in an alternative embodiment, the battery cell 40 could be replaced with another type of energy storage cell. For example, the battery cell 40 could be replaced with an ultracapacitor with first and second electrical terminals extending therefrom, or replaced with a supercapacitor with first and second electrical terminals extending therefrom.

Referring to FIGS. 3-7, the thin profile sensor 50 is configured to determine a state-of-charge value of the battery cell 40 and to control the state-of-charge of the battery cell 40 based on the state-of-charge value. For example, in an exemplary embodiment, the thin profile sensor 50 utilizes the sensing circuit 100 to determine a state-of-charge value of the battery cell 40, and controls the heat generating circuit 108 to adjust a state-of-charge of the battery cell 40 based on the state-of-charge value.

Figure 3:
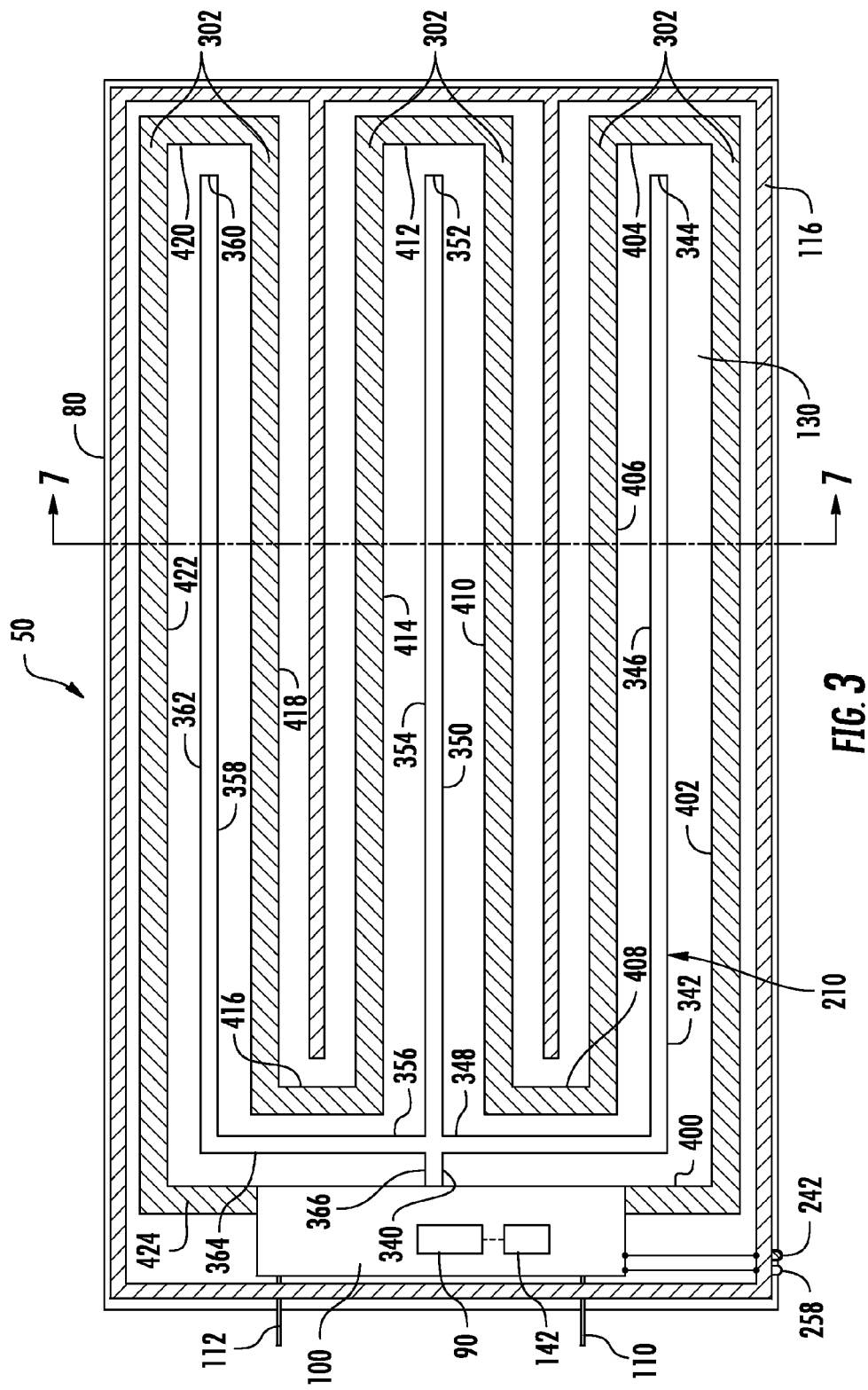
FIG. 3 is a schematic of a first side of a thin profile sensor utilized in the battery cell assembly of FIG. 1.
Figure 5:
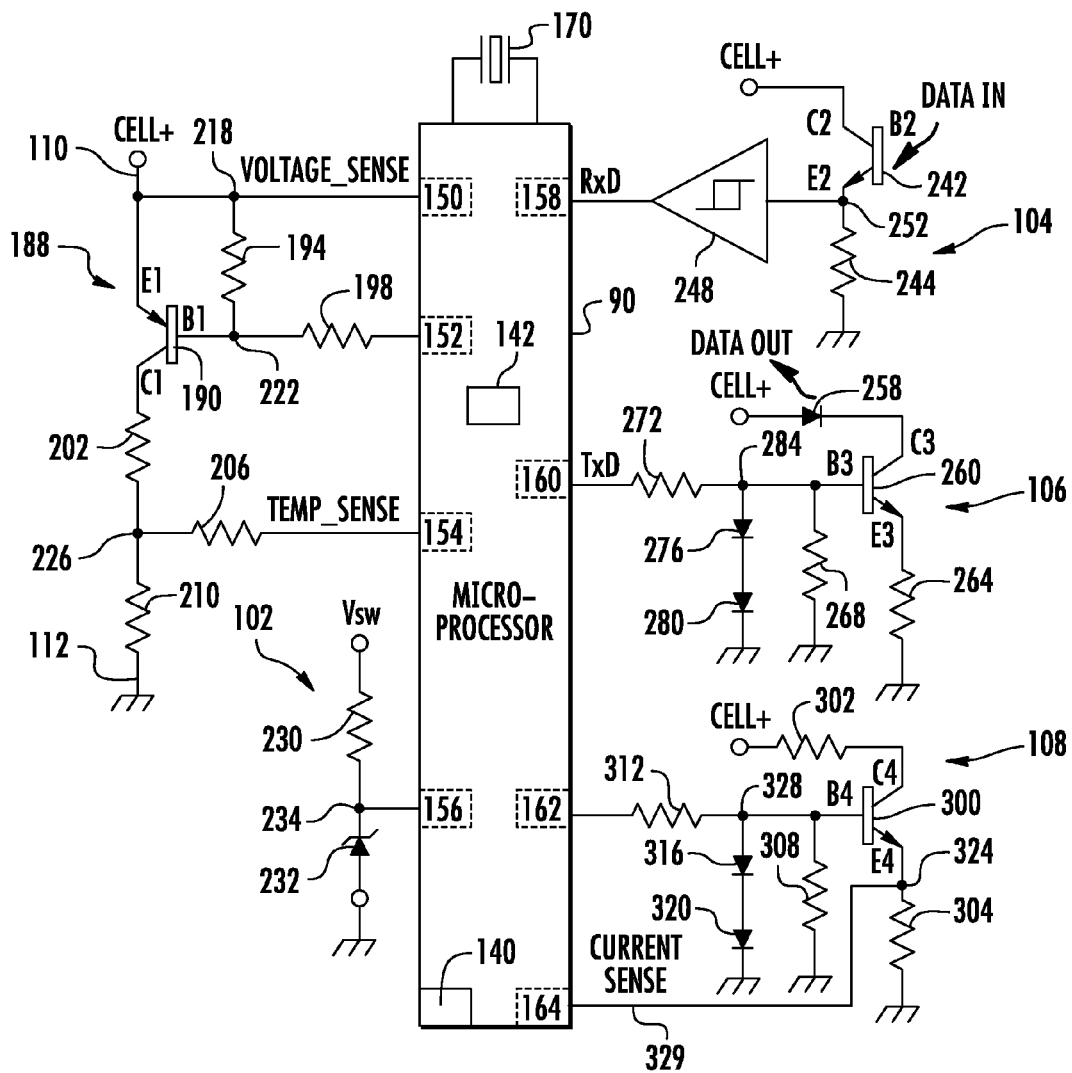
FIG. 5 is an electrical schematic of a sensing circuit, a reference voltage circuit, a data transmitting circuit, a data receiving circuit, and a heat generating circuit, utilized in the thin profile sensor of FIG. 3.

Referring to FIGS. 3, 5 and 7, the thin profile sensor 50 includes a flexible plastic sheet 80, a microprocessor 90, a sensing circuit 100, a reference voltage circuit 102, a data receiving circuit 104, a data transmitting circuit 106, a heat generating circuit 108, and leads 110, 112. The microprocessor 90 is operably and electrically coupled to the sensing circuit 100, the data receiving circuit 104, the data transmitting circuit 106, and the heat generating circuit 108. The microprocessor 90, the sensing circuit 100, the data receiving circuit 104, the data transmitting circuit 106, and the heat generating circuit 108 are coupled to the first side 130 of the flexible plastic sheet 80.

Referring to FIGS. 1, 3 and 6, the flexible plastic sheet 80 is provided to hold the remaining components of the thin profile sensor 50 thereon. The flexible plastic sheet 80 includes the first side 130 and the second side 132. The flexible plastic sheet 80 is sized and shaped to cover substantially an entire outer surface 66 on a first side of the housing 60 of the battery cell 40. In one exemplary embodiment, the flexible plastic sheet 80 has a substantially rectangular shape. In an alternative embodiment, the flexible plastic sheet 80 could have another shape configured to cover an outer surface of a battery cell.

Figure 12:
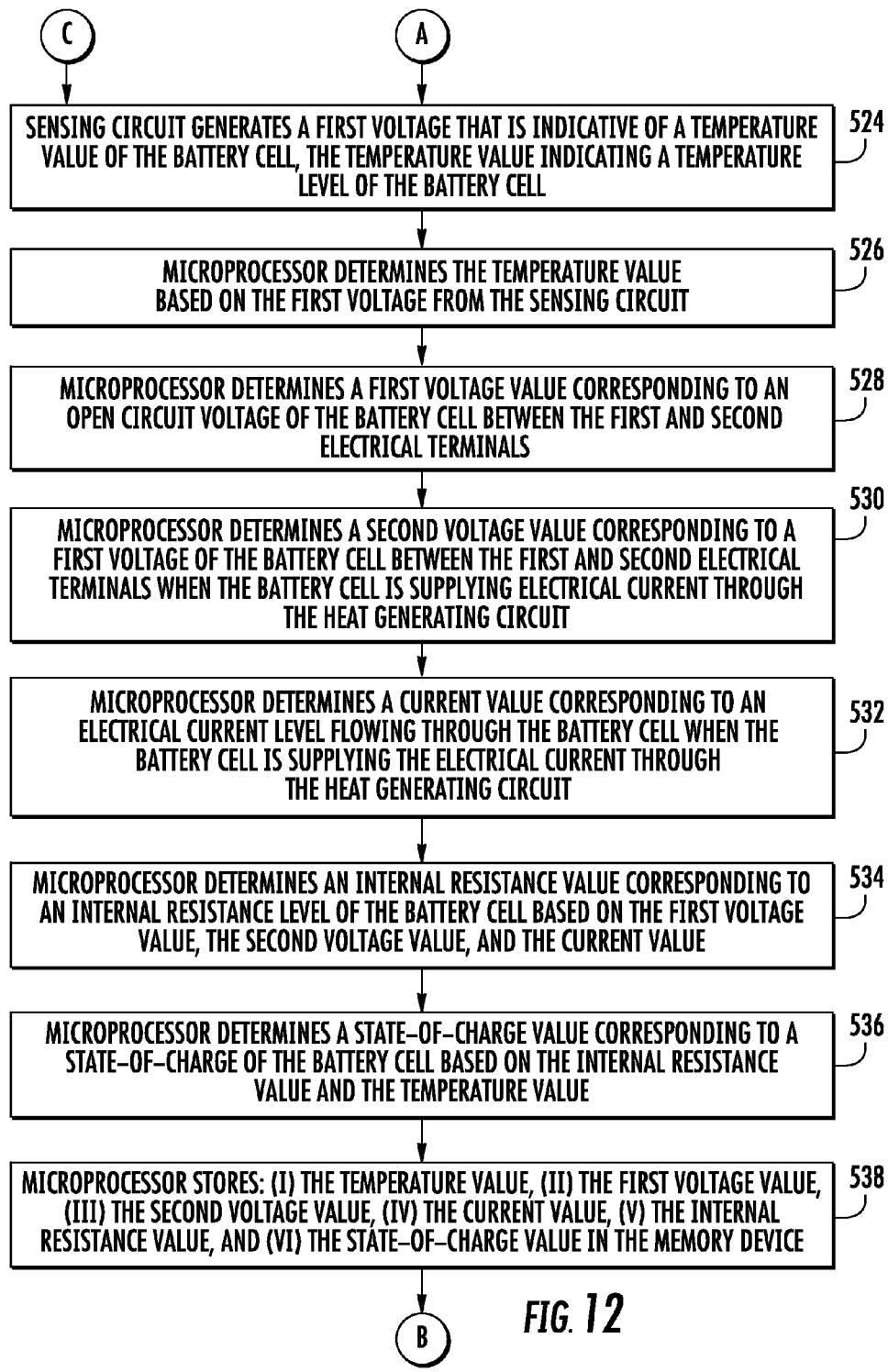
Figure 13:
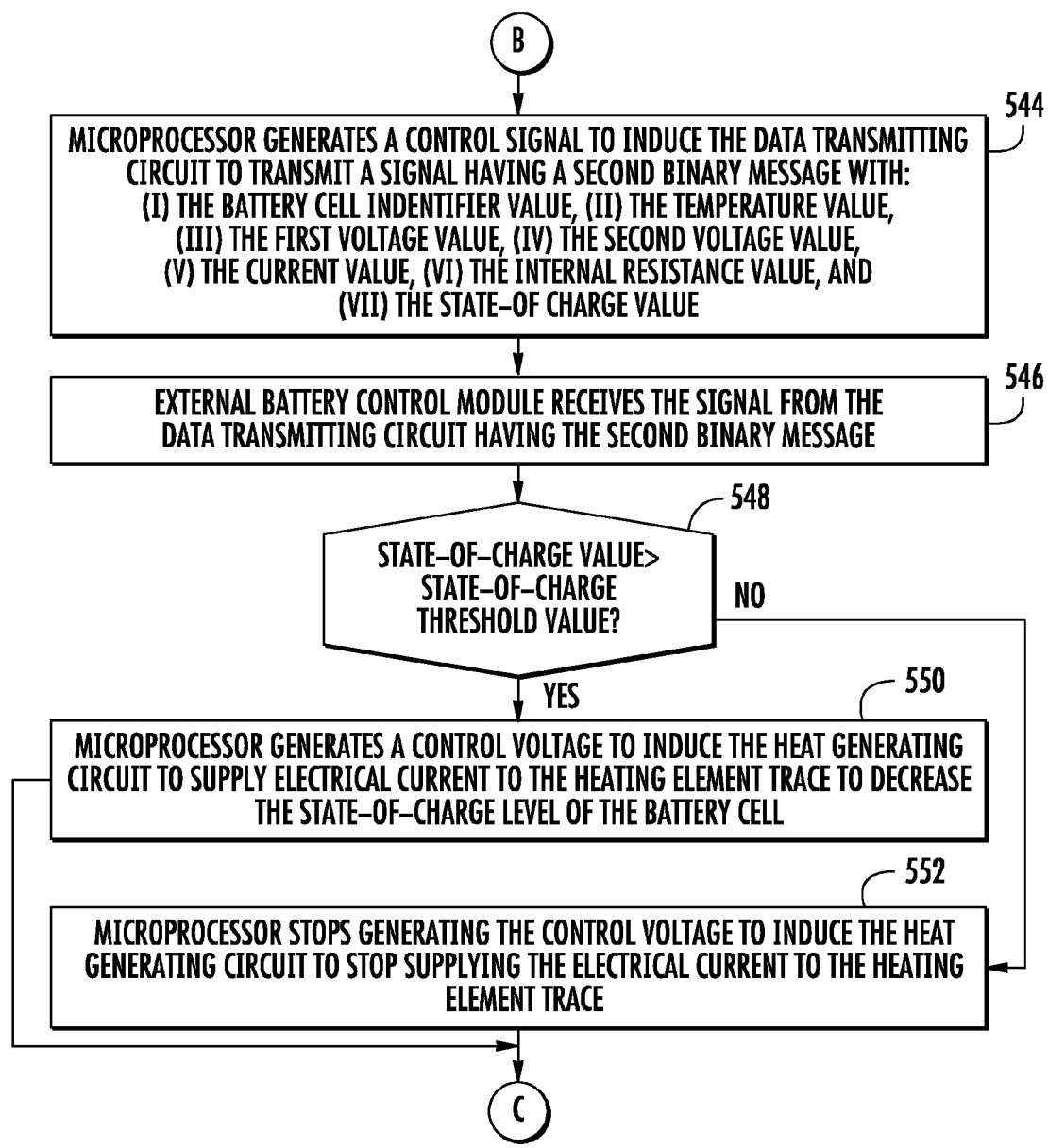

Referring to FIGS. 1, 3, 4 and 5, the microprocessor 90 is programmed to determine a state-of-charge value of the battery cell 40 and to control the state-of-charge of the battery cell 40 based on the state-of-charge value, as will be described in greater detail below. The microprocessor 90 includes a memory device 140, an analog-to-digital converter 142 having input-output (I/O) ports 150, 152, 154, 156, 158, 160, 162, and an oscillator 170. The microprocessor 90 is electrically coupled to the electrical terminals 62, 64 of the battery cell 40 via the leads 110, 112. The electrical terminals 62, 64 are configured to supply an operational voltage to the microprocessor 90. In an exemplary embodiment, the microprocessor 90 is coupled directly to the first side 130 of the flexible plastic sheet 80 utilizing an adhesive or another attachment means. In an alternative embodiment, the microprocessor 90 is coupled directly to a circuit board 119 (shown in FIG. 12), and the circuit board 119 is coupled directly to the first side 130 of the flexible plastic sheet 80 utilizing an adhesive or another attachment means. In yet another alternative embodiment, the microprocessor 90 is disposed on the second side 132 of the flexible plastic sheet 80. The microprocessor 90 utilizes software instructions and/or data stored in the memory device 140 to implement at least part of the tasks described herein with respect to the microprocessor 90.

The sensing circuit 100 is configured to generate a signal that is indicative a temperature value of the battery cell 40. The temperature value indicates a temperature level of the battery cell 40. In the illustrated embodiment, the sensing circuit 100 is coupled directly to the flexible plastic sheet 80. Of course, in an alternative embodiment, at least some of the components of the sensing circuit 100 could be disposed on a circuit board 119 (shown in FIG. 12) which is further coupled to the flexible plastic sheet 80. Further, in the illustrated embodiment, the sensing circuit 100 is directly coupled to the first side 130 of the flexible plastic sheet 80. Of course, in an alternative embodiment, the sensing circuit 100 could be directly coupled to the second side 132 of the flexible plastic sheet 80. The sensing circuit 100 includes a transistor 190, resistors 194, 198, 202, 206, a resistive trace 210, and nodes 218, 222, 226. The resistive trace 210 has a resistance level that varies based on a temperature level of the battery cell 40.

Referring to FIG. 5, the transistor 190 includes a base B1, an emitter E1, and a collector C1. The emitter E1 is electrically coupled to a node 218 which is further electrically coupled to an operational voltage on a positive electrical terminal of the battery cell 40. The node 218 is further electrically coupled to the I/O port 150 of the microprocessor 90. The base B1 is electrically coupled to a node 222. The resistor 194 is electrically coupled between the node 222 and the node 218. Further, the resistor 198 is electrically coupled between the node 222 and the I/O port 152. The resistor 202 is electrically coupled between the collector C1 and the node 226. Further, the resistive trace 210 is electrically coupled between the node 226 and a negative electrical terminal of the battery cell 40. Thus, the resistor 202 is electrically coupled in series with the resistive trace 210, and the electrical node 226 is electrically coupled therebetween. The resistor 202 is further electrically coupled to an operational voltage when the transistor 190 is turned on. The resistor 206 is electrically coupled between the node 226 and the I/O port 154.

Referring to FIGS. 3 and 5, the resistive trace 210 has a resistance level that varies based on a temperature level of the battery cell 40, and is used by the microprocessor 90 to determine the temperature level of the battery cell 40. In one exemplary embodiment, the resistive trace 210 is disposed directly on the first side 130 of the flexible plastic sheet 80. In an alternative embodiment, the resistive trace 210 is disposed on the second side 132 of the flexible plastic sheet 80. The resistive trace 210 includes resistive trace portions 340, 342, 344, 346, 348, 350, 352, 354, 356, 358, 360, 362, 364, 366 which are electrically coupled in series to one another. As shown, the resistive traces 342, 346, 350, 354, 358, 362 are spaced apart from one another and extend substantially parallel to one another longitudinally along the first side 130 of the flexible plastic sheet 80. In an exemplary embodiment, the resistive trace 210 has a thickness in a range of 0.33-1.0 millimeters. Of course, in an alternative embodiment, the resistive trace 210 could have a thickness greater than 1.0 millimeter. In an exemplary embodiment, the resistive trace 210 is printed on the flexible plastic sheet 80 and is constructed of at least one of graphite, nickel, tin, silver, copper, or an alloy of at least two of the foregoing materials.

In an alternative embodiment, the resistive trace 210 could have a different configuration on the flexible plastic sheet 80. For example, the resistive trace 210 could comprise a first plurality of trace portions that extend parallel to one another that are coupled together at end regions thereof with one or more trace portions disposed substantially perpendicular to the first plurality of trace portions to provide desired temperature sensing coverage of the battery cell 40. Further, for example, the resistive trace 210 could comprise another combination of parallel extending trace portions coupled to one or more series trace portions to provide desired temperature sensing coverage of the battery cell 40.

Since the resistive trace 210 has a resistance that varies based on a temperature of the battery cell 40, when the transistor 190 is turned on, a voltage at the node 226 is indicative of a temperature level of the battery cell 40. Still further, a voltage applied to the I/O port 154 is further indicative of a temperature level of the battery cell 40.

To determine a temperature level of the battery cell 40, the microprocessor 90 is programmed to output a low logic level voltage on the I/O port 152 to turn on the transistor 190. When the transistor 190 is turned on, the microprocessor 90 is programmed to measure the voltage (temp_sense) on the resistor 206 at the I/O port 154. The microprocessor 90 is further programmed to determine a temperature value representing the temperature level of the battery cell 40 based on the voltage (temp_sense). In an exemplary embodiment, the microprocessor 90 utilizes a lookup table stored in the memory device 140 that has a plurality of voltage values (corresponding to voltage levels at the I/O port 154) and a plurality of associated temperature levels of the battery cell 40. The microprocessor 90 utilizes a measured voltage level as an index to access an associated temperature value in the lookup table, which corresponds to a temperature level of the battery cell 40.

The microprocessor 90 is further programmed to measure a voltage on the I/O port 150 to determine either a $V_{open}$ or a $V_{load}$ voltage of the battery cell 40. In particular, the microprocessor 90 measures a voltage on the I/O port 150 when the transistor 300 is turned off which corresponds to the $V_{open}$ voltage level of the battery cell 40. Alternately, the microprocessor measures a voltage on the I/O port 151 the transistor 300 is turned on, which corresponds to the $V_{load}$ voltage level of the battery cell 40.

The reference voltage circuit 102 is provided to input a reference voltage to the I/O port 156 of the microprocessor 90. In the illustrated embodiment, the reference voltage circuit 102 is coupled directly to the flexible plastic sheet 80. Of course, in an alternative embodiment, at least some of the components of the reference voltage circuit 102 could be disposed on a circuit board 119 (shown in FIG. 12) which is further coupled to the flexible plastic sheet 80. In the illustrated embodiment, the reference voltage circuit 102 is directly coupled to the first side 130 of the flexible plastic sheet 80. Of course, in an alternative embodiment, the reference voltage circuit 102 could be directly coupled to the second side 132 of the flexible plastic sheet 80. The reference voltage circuit 102 includes a resistor 230, a diode 232, and a node 234. The resistor 230 is electrically coupled between an operational voltage and the node 234. The diode 232 is electrically coupled between the node 234 and a negative electrical terminal of the battery cell 40. The node 234 is further electrically coupled to the I/O port 156.

Referring to FIGS. 1 and 5, the data receiving circuit 104 is provided to allow the thin profile sensor 50 to receive data from the battery control module 30. In the illustrated embodiment, the data receiving circuit 104 is coupled directly to the flexible plastic sheet 80. Of course, in an alternative embodiment, at least some of the components of the data receiving circuit 104 could be disposed on the circuit board 119 (shown in FIG. 12) which is further coupled to the flexible plastic sheet 80. Further, in the illustrated embodiment, the data receiving circuit 104 is directly coupled to the first side 130 of the flexible plastic sheet 80. Of course, in an alternative embodiment, the data receiving circuit 104 could be directly coupled to the second side 132 of the flexible plastic sheet 80. The data receiving circuit 104 includes an infrared receiving transistor 242, a resistor 244, a voltage buffer 248, and the node 252. The transistor 242 includes a base B2, a collector C2, and an emitter E2. The collector C2 is electrically coupled to a positive voltage terminal of the battery cell 40. The emitter E2 is electrically coupled to a node 252 which is further coupled to the resistor 244. The resistor 244 is electrically coupled between the node 252 and a negative electrical terminal of the battery cell 40. The voltage buffer 248 is electrically coupled between the node 252 and the I/O port 158 of the microprocessor 90. When the base B2 receives infrared light having a threshold light level, the transistor 242 turns on and supplies a voltage through the voltage buffer 248 to the I/O port 158. Accordingly, when the infrared light has a binary message contained therein, the transistor 242 iteratively turns on and off to supply a binary voltage message through the voltage buffer 248 to the I/O port 158.

The data receiving circuit 104 is configured to receive a signal having a binary message therein corresponding to a threshold operational parameter value associated with the battery cell 40. For example, in an exemplary embodiment, the signal corresponds to an infrared light signal. Further, in an exemplary embodiment, the threshold operational parameter value corresponds to a state-of-charge threshold value of the battery cell 40. Of course, in an alternative embodiment, the data receiving circuit 104 could have a radio frequency (RF) receiver operably coupled to the I/O port 158, and the received signal having the binary message could correspond to an RF signal. Further, in an alternative embodiment, the threshold operational parameter value could correspond to another threshold parameter value associated with the battery cell 40.

After receiving the signal with the binary message therein, the data receiving circuit 104 is further configured to output a voltage signal having the binary message in response to the received signal. The binary message represents the threshold operational parameter value of the battery cell 40, and is received by the microprocessor 90. In an exemplary embodiment, the binary message has a threshold operational parameter value corresponding to a state-of-charge threshold value of the battery cell 40.

Figure 10:
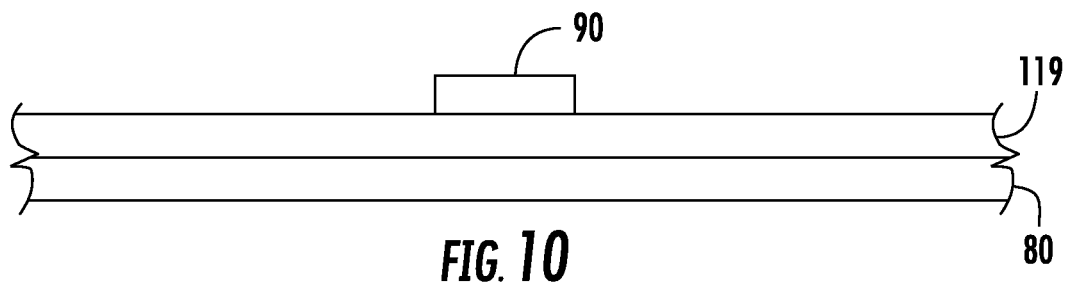
FIG. 10 is a schematic of a portion of a thin profile sensor in accordance with another exemplary embodiment.
Figure 11:
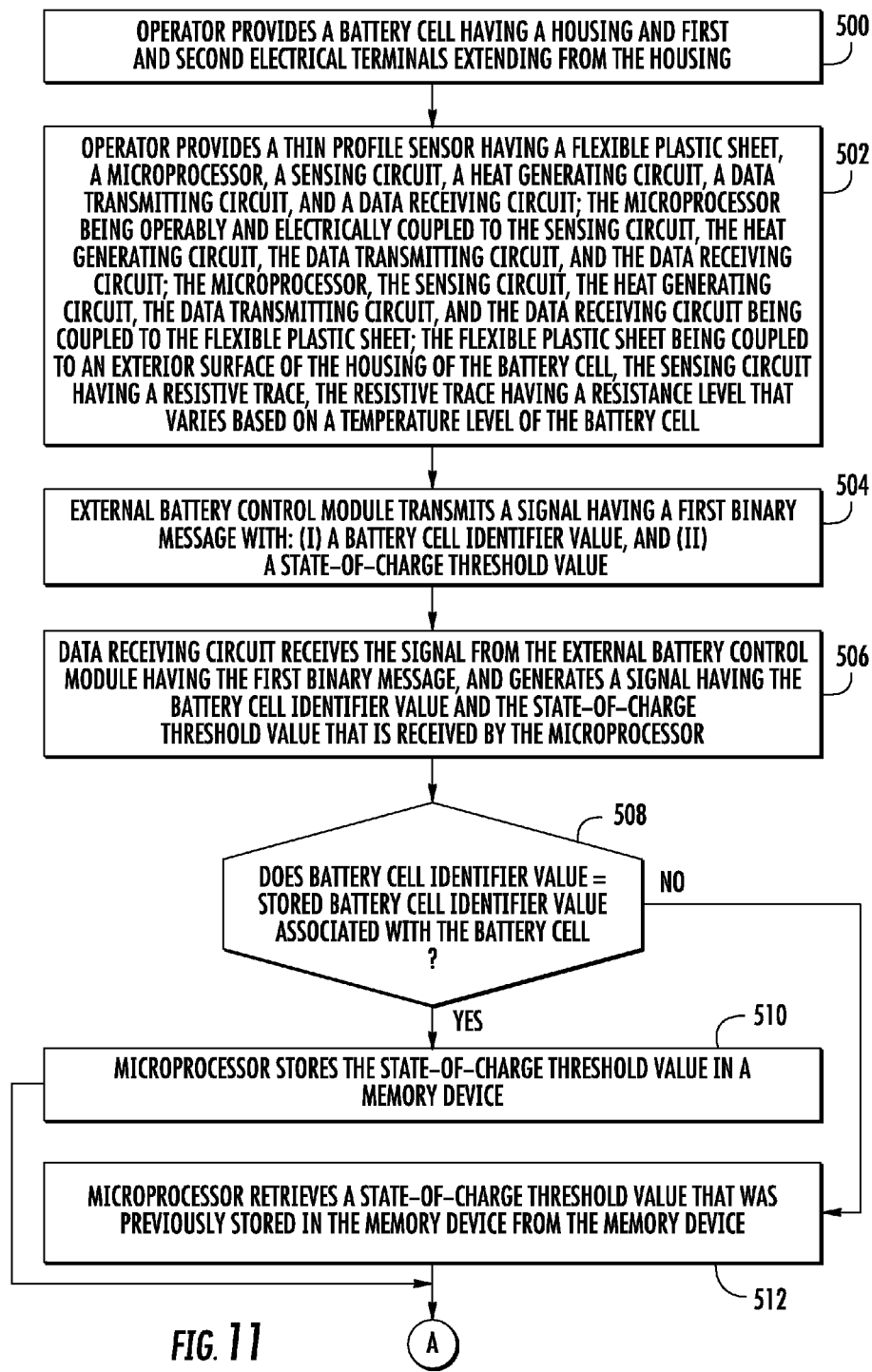
FIGS. 11-13 are flowcharts of a method for determining an internal resistance value and a state-of-charge value of a battery cell, and for controlling the state-of-charge of the battery cell utilizing the thin profile sensor of FIG. 3.

The data transmitting circuit 106 is provided to allow the thin profile sensor 50 to transmit data to the battery control module 30. In particular, the microprocessor 90 is programmed to generate a control signal to induce the data transmitting circuit 106 to transmit a signal having a first binary message therein representing measured or determined operational parameter values of the battery cell 40. In the illustrated embodiment, the data transmitting circuit 106 is coupled directly to the flexible plastic sheet 80. Of course, in an alternative embodiment, at least some of the components of the data transmitting circuit 106 could be disposed on the circuit board 119 (shown in FIG. 10) which is further coupled to the flexible plastic sheet 80. Further, in the illustrated embodiment, the data transmitting circuit 106 is directly coupled to the first side 130 of the flexible plastic sheet 80. Of course, in an alternative embodiment, the data transmitting circuit 106 could be directly coupled to the second side 132 of the flexible plastic sheet 80. The data transmitting circuit 106 includes an infrared transmitting diode 258, the transistor 260, resistors 264, 268, 272, diodes 276, 280, and a node 284.

The transistor 260 includes a base B3, a collector C3, and an emitter E3. The infrared transmitting diode 258 is electrically coupled between the collector C3 and the positive electrical terminal of the battery cell 40. The resistor 264 is electrically coupled between the emitter E3 and a negative electrical terminal of the battery cell 40. The resistor 268 is electrically coupled between the base B3 and a negative electrical terminal of the battery cell 40. The base B3 is further electrically coupled to a node 284. The diodes 276, 280 electrically coupled in series between the node 284 and a negative electrical terminal of the battery cell 40. The resistor 272 is electrically coupled between the node 284 and the I/O port 160 of the microprocessor 90.

When the microprocessor 90 directs the I/O port 160 to output a high logic level voltage, the transistor 260 turns on and the infrared transmitting diode 258 emits infrared light. Accordingly, when the microprocessor 90 desires to output a signal having a binary message therein corresponding to a measured operational parameter value of the battery cell 40, the microprocessor 90 controls the voltage output by the I/O port 160 to generate the infrared light signal having the binary message therein. In an exemplary embodiment, the binary message has measured or determined operational parameter values of the battery cell 40 including: (i) a temperature value, (ii) a first voltage value (e.g., value corresponding to open circuit voltage $V_{open}$), (iii) a second voltage value (e.g., value corresponding to $V_{load}$), (iv) a current value (e.g., value corresponding to $I_{load}$), (v) an internal resistance value, and (vi) a state-of-charge value.

Referring to FIGS. 3 and 5, the heat generating circuit 108 is provided to generate heat when a state-of-charge value of the battery cell 40 is greater than a state-of-charge threshold value. In the illustrated embodiment, the heat generating circuit 108 is coupled directly to the flexible plastic sheet 80. Of course, in an alternative embodiment, at least some of the components of the heat generating circuit 108 could be disposed on the circuit board 119 (shown in FIG. 12) which is further coupled to the flexible plastic sheet 80. Further, in the illustrated embodiment, the heat generating circuit 108 is directly coupled to the first side 130 of the flexible plastic sheet 80. Of course, in an alternative embodiment, the heat generating circuit 108 could be directly coupled to the second side 132 of the flexible plastic sheet 80. The heat generating circuit 108 includes a transistor 300, a heating element trace 302, resistors 304, 308, 312, diodes 316, 320, nodes 324, 328, and a sense line 329.

The transistor 300 includes a base B4, a collector C4, and an emitter E4. The heating element trace 302 is electrically coupled between the collector C4 and the positive electrical terminal of the battery cell 40. The resistor 304 is electrically coupled between the emitter E4 and a negative electrical terminal of the battery cell 40. The sense line 329 is electrically coupled between the emitter E4 and the I/O port 164 of the microprocessor 90. The base B4 is electrically coupled to a node 328. The diodes 316, 320 are electrically coupled in series between the node 328 and a negative electrical terminal of the battery cell 40. The resistor 312 is electrically coupled between the node 328 and the I/O port 162 of the microprocessor 90.

The heating element trace 302 is configured to generate heat when a voltage is applied across the heating element trace 302. In the illustrated embodiment, the heating element trace 302 is a substantially serpentine-shaped heating element trace disposed directly on the flexible plastic sheet 80. Further, the heating element trace 302 includes heating element trace portions 400, 402, 404, 406, 408, 410, 412, 414, 416, 418, 420, 422, 424 coupled in series with one another. Further, in the exemplary embodiment, the heating element trace 302 is printed on the flexible plastic sheet 80 and is constructed of at least one of graphite, nickel, tin, silver, copper, or an alloy of at least two of the foregoing materials. In an alternative embodiment, the heating element trace 302 could have a different configuration on the flexible plastic sheet 80. For example, the heating element trace 302 could comprise a first plurality of heating element trace portions that extend parallel to one another that are coupled together at end regions thereof with one or more heating element trace portions disposed substantially perpendicular to the first plurality of heating element trace portions to provide desired heating coverage of the battery cell 40. Further, for example, the heating element trace 302 could comprise another combination of parallel extending heating element trace portions coupled to one or more series heating element trace portions to provide desired heating coverage of the battery cell 40.

During operation, the microprocessor 90 is programmed to generate a control voltage to induce the transistor 300 of the heat generating circuit 108 to supply electrical current to the heating element trace 302 to generate heat if the state-of-charge value of the battery cell 40 is greater than a state-of-charge threshold value. Further, the microprocessor 90 is programmed to stop generating the control voltage to induce the transistor 300 of the heat generating circuit 108 to stop supplying the electrical current to the heating element trace 302 to induce the heating element trace 302 to stop generating heat if the state-of-charge value of the battery cell 40 is less than or equal to the state-of-charge threshold value.

The microprocessor 90 is further programmed to determine an $I_{load}$ current value of the battery cell 40 by measuring a voltage at the node 324 when the transistor 300 is turned on. The microprocessor 90 calculates the $I_{load}$ current value utilizing the following equation: $I_{load}$=voltage at node 324/ known resistance value of resistor 304.

The microprocessor 90 is further programmed to determine an internal resistance value corresponding to an internal resistance level of the battery cell 40 based on the following equation: internal resistance=$(V_{load}-V_{open})/(I_{load}-I_{open})$, wherein $I_{open}$ is equal to 0.

Figure 14:
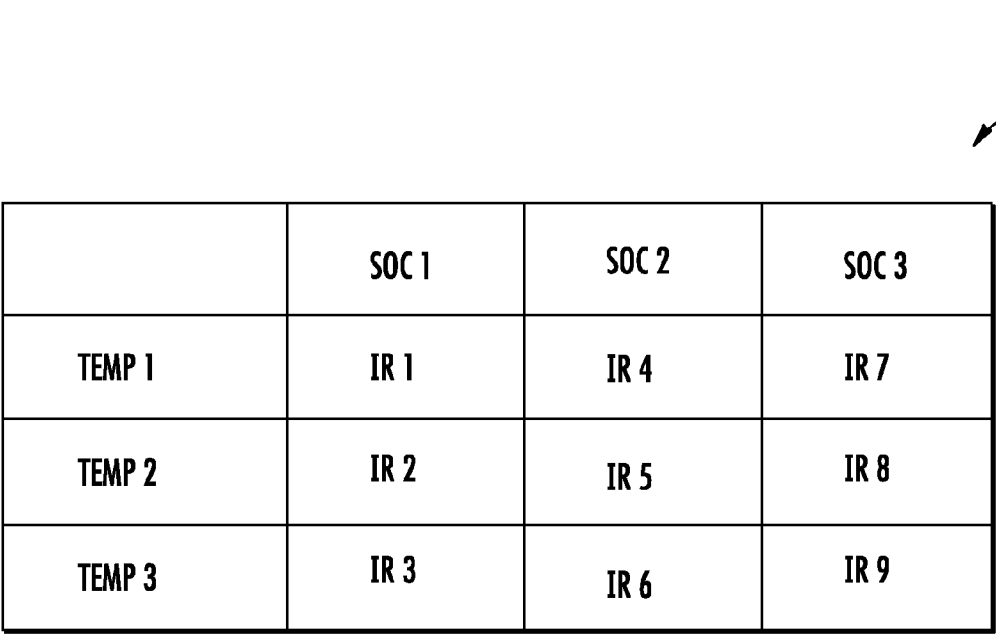
FIG. 14 is a schematic of a table of state-of-charge values indexed by temperature values and internal resistance values, utilized to determine a state-of-charge value of a battery cell.

The microprocessor 90 is further programmed to determine a state-of-charge value corresponding to a state-of-charge of the battery cell 40 based on a temperature value and an internal resistance value associated with the battery cell 40. Referring to FIG. 14, a table 570 having a plurality of temperature values (e.g., TEMP1, TEMP2, TEMP3), a plurality of internal resistance values (e.g., IR1, IR2, IR3, IR4, IR5, IR6, IR7, IR8, IR9), and a plurality of state-of-charge values (e.g., SOC1, SOC2, SOC3). In one exemplary embodiment, during operation, the microprocessor 90 utilizes the table 570 to determine a state-of-charge value of the battery cell 40. In particular, the microprocessor 90 utilizes a temperature value and an internal resistance value as indexes to select a state-of-charge value from the table 570 which corresponds to the state-of-charge value of the battery cell 40. For example, if the microprocessor 90 determines that the temperature value is TEMPE and the internal resistance value is IR1, then microprocessor 90 utilizes TEMP1 and IR1 as indexes in the table 570 to retrieve SOC1 from the table 570 which corresponds to the state-of-charge value of the battery cell 40.

Figure 4:
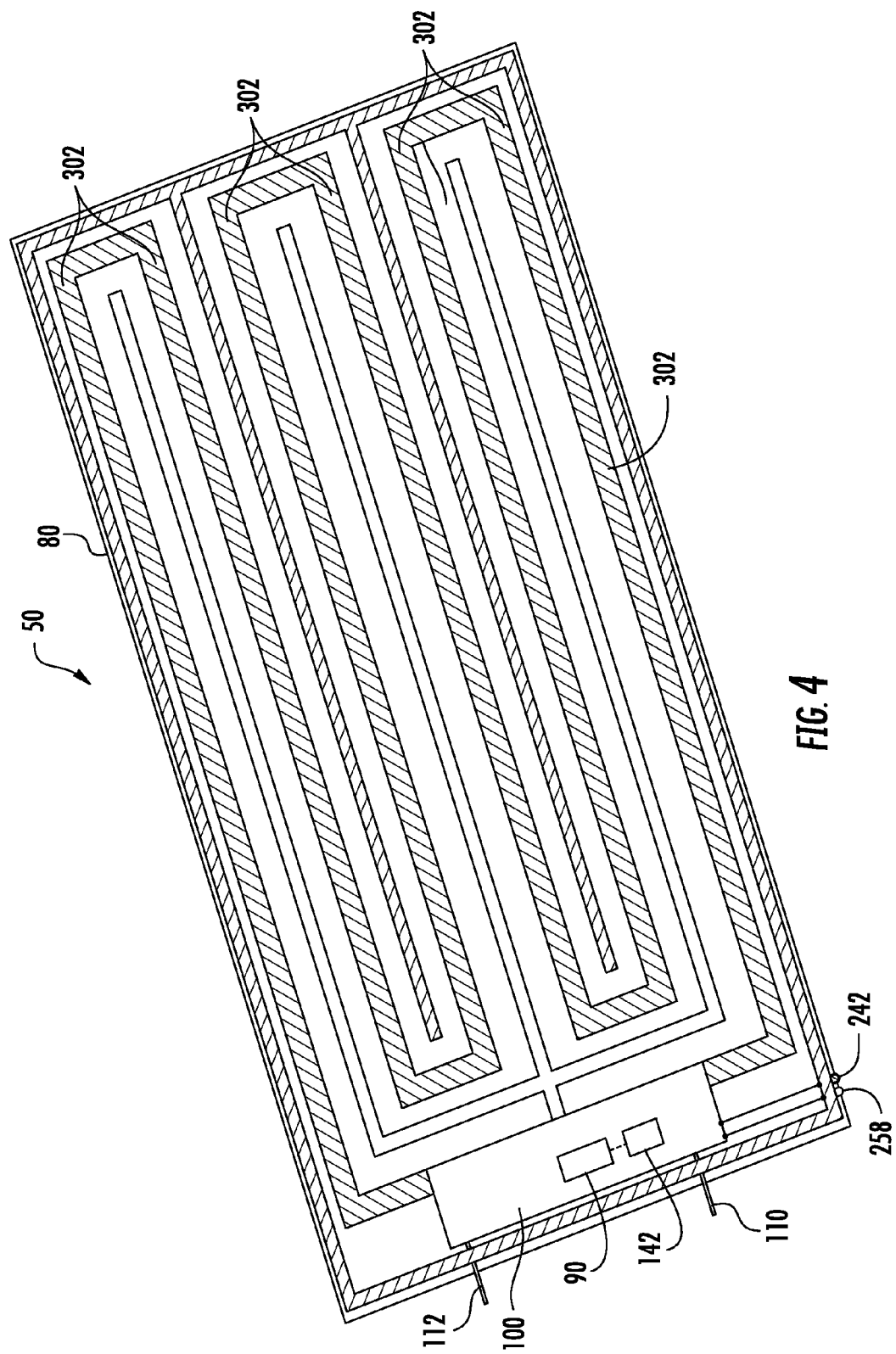
FIG. 4 is another schematic of the thin profile sensor of FIG. 3.
Figure 9:
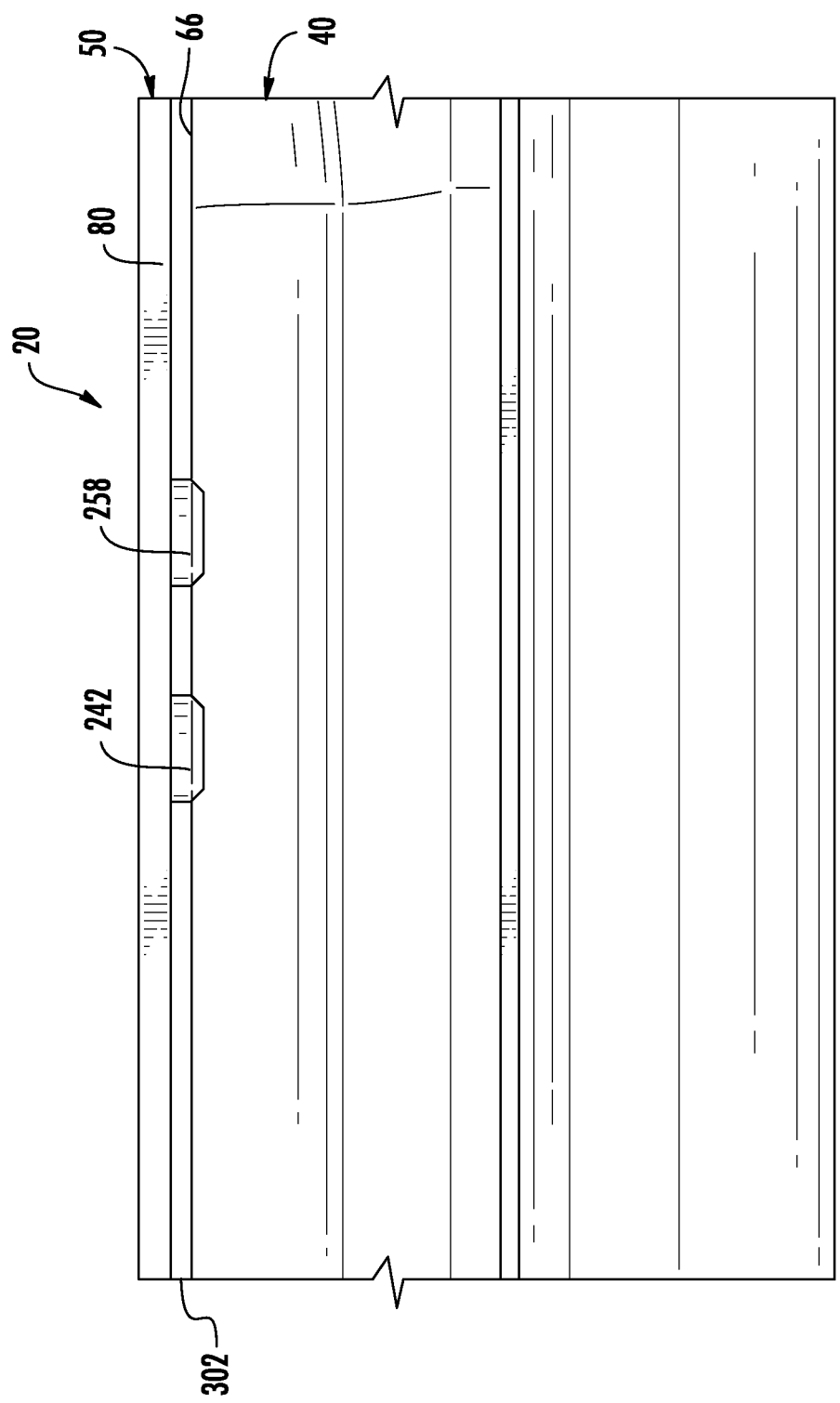
FIG. 9 is an enlarged side view of a portion of the battery cell assembly of FIG. 1.

Referring to FIGS. 3, 4 and 9, the adhesive portion 302 is provided to couple the flexible plastic sheet 80 to the exterior surface of the housing 60 of the battery cell 40. The adhesive portion 302 is disposed on the first side 130 on a peripheral region of the flexible plastic sheet 80. In particular, the adhesive portion 302 is disposed on a peripheral region of the flexible plastic sheet 82 surround the remaining components of the thin profile sensor 50. When the first side 130 of the thin profile sensor 50 is disposed on the exterior surface 66 of the housing 60, the adhesive portion 302 couples the flexible plastic sheet 80 to the exterior surface of the housing 60 and prevents dust, dirt, and other undesirable substances from contacting the microprocessor 90, the sensing circuit 100, the reference voltage circuit 102, the data transmitting circuit 106, the data receiving circuit 104, and the heat generating circuit 108 which are sandwiched and disposed between the flexible plastic sheet 80 and the exterior surface 66 of the housing 60.

Referring to FIGS. 1, 3, 5 and 11-13, a flowchart of a method for determining operational parameter values associated with a battery cell 40 and for controlling a state-of-charge value of the battery cell 40 based on the operational parameter values will now be described.

At step 500, an operator provides the battery cell 40 having the housing 60 and first and second electrical terminals 62, 64 extending from the housing 60. After step 500, the method advances to step 502.

At step 502, the operator provides the thin profile sensor 50 having the flexible plastic sheet 80, the microprocessor 90, the sensing circuit 100, the heat generating circuit 108, the data transmitting circuit 106, and the data receiving circuit 104. The microprocessor 90 is operably and electrically coupled to the sensing circuit 100, the heat generating circuit 108, the data transmitting circuit 106, and the data receiving circuit 104. The microprocessor 90, the sensing circuit 100, the heat generating circuit 108, the data transmitting circuit 106, and the data receiving circuit 104 are coupled to the flexible plastic sheet 80. The flexible plastic sheet 80 is coupled to an exterior surface 66 of the housing 60 of the battery cell 40. The sensing circuit 100 has a resistive trace 210. The resistive trace 210 has a resistance level that varies based on a temperature level of the battery cell 40. After step 502, the method advances to step 504.

At step 504, the external battery control module 30 transmits a signal having a first binary message with: (i) a battery cell identifier value, and (ii) a state-of-charge threshold value.

In an exemplary embodiment, the signal is a wireless signal. After step 504, the method advances to step 506.

At step 506, the data receiving circuit 104 receives the signal from the external battery control module 30 having the first binary message, and generates a signal having the battery cell identifier value and the state-of-charge threshold value that is received by the microprocessor 90. After step 506, the method advances to step 508.

At step 508, the microprocessor 90 makes a determination as to whether the battery cell identifier value equals a stored battery cell identifier value associated with the battery cell 40. If the value step 508 equals "yes", the method advances to step 510. Otherwise, the method advances to step 512.

At step 510, the microprocessor 90 stores the state-of-charge threshold value in the memory device 140. After step 510, the method advances to step 524.

Referring again to step 508, if the value of step 508 equals "no", the method advances to step 512. At step 512, the microprocessor 90 retrieves a state-of-charge threshold value that was previously stored in the memory device 140, from the memory device 140. After step 512, the method advances to step 524.

At step 524, the sensing circuit 100 generates a first voltage that is indicative of a temperature value of the battery cell 40. The temperature value indicates a temperature level of the battery cell 40. After step 524, the method advances to step 526.

At step 526, the microprocessor 90 determines the temperature value based on the first voltage from the sensing circuit 100. After step 526, the method advances to step 528.

At step 528, the microprocessor 90 determines a first voltage value corresponding to an open circuit voltage of the battery cell 40 between the first and second electrical terminals 62, 64. After step 528, the method advances to step 530.

At step 530, the microprocessor 90 determines a second voltage value corresponding to a first voltage of the battery cell 40 between the first and second electrical terminals 62, 64 when the battery cell 40 is supplying electrical current through the heat generating circuit 108. After step 530, the method advances to step 532.

At step 532, the microprocessor 90 determines a current value corresponding to an electrical current level flowing through the battery cell 40 when the battery cell 40 is supplying the electrical current through the heat generating circuit 108. After step 532, the method advances to step 534.

At step 534, the microprocessor 90 determines an internal resistance value corresponding to an internal resistance level of the battery cell 40 based on the first voltage value, the second voltage value, and the current value. In particular, the microprocessor determines the internal resistance value utilizing the following equation: internal resistance=$(V_{load}-V_{open})/(I_{load}-I_{open})$, wherein $I_{open}$ is equal to 0. After step 534, the method advances to step 536.

At step 536, the microprocessor 90 determines a state-of-charge value corresponding to a state-of-charge of the battery cell 40 based on the internal resistance value and the temperature value. After step 536, the method advances to step 538.

At step 538, the microprocessor 90 stores: (i) the temperature value, (ii) the first voltage value, (iii) the second voltage value, (iv) the current value, (v) the internal resistance value, and (vi) the state-of-charge value in the memory device 140. After step 538, the method advances to step 544.

At step 544, the microprocessor 90 generates a control signal to induce the data transmitting circuit 106 to transmit a signal having a second binary message with: (i) the battery cell identifier value, (ii) the temperature value, (iii) the first voltage value, (iv) the second voltage value, (v) the current value, (vi) the internal resistance value, and (vii) the state-of-charge value. After step 544, the method advances to step 546.

At step 546, the external battery control module 30 receives the signal from the data transmitting circuit 106 having the second binary message. After step 546, the method advances the step 548.

At step 548, the microprocessor 90 makes a determination as to whether the state-of-charge value is greater than a state-of-charge threshold value. If the value of step 548 equals "yes", the method advances to step 550. Otherwise, the method advances to step 552.

At step 550, the microprocessor 90 generates a control voltage to induce the heat generating circuit 108 to supply electrical current to the heating element trace 302 to decrease the state-of-charge level of the battery cell 40. After step 550, the method returns to step 524.

Referring again to step 548, if the value of step 548 equals "no", the method advances to step 552. At step 552, the microprocessor 90 stops generating the control voltage to induce the heat generating circuit 108 to stop supplying the electrical current to the heating element trace 302. After step 552, the method returns to step 524.

The above-described method can be at least partially embodied in the form of one or more computer readable media having computer-executable instructions for practicing the methods. The computer-readable media can comprise one or more of the following: hard drives, RAM, ROM, flash memory, and other computer-readable media known to those skilled in the art; wherein, when the computer-executable instructions are loaded into and executed by one or more microprocessors, the one or more microprocessors become an apparatus for practicing the methods.

The battery cell assembly provides a substantial advantage over other assemblies. In particular, battery cell assembly provides a technical effect of utilizing a thin profile sensor coupled to an exterior surface of the battery cell to determine an internal resistance value and a state-of-charge value associated with the battery cell, and to control a state-of-charge of the battery cell based on the state-of-charge value. In particular, the thin profile sensor determines an internal resistance value and a state-of-charge value associated with the battery cell utilizing a sensing circuit, and controls a heat generating circuit to adjust a state-of-charge of the battery cell based on the state-of-charge value.

While the claimed invention has been described in detail in connection with only a limited number of embodiments, it should be readily understood that the invention is not limited to such disclosed embodiments. Rather, the claimed invention can be modified to incorporate any number of variations, alterations, substitutions or equivalent arrangements not heretofore described, but which are commensurate with the spirit and scope of the invention. Additionally, while various embodiments of the claimed invention have been described, it is to be understood that aspects of the invention may include only some of the described embodiments. Accordingly, the claimed invention is not to be seen as limited by the foregoing description.

What is claimed is:

1. A battery cell assembly, comprising:
a pouch-type battery cell having a housing and first and second electrical terminals extending outwardly from the housing;
a thin profile sensor having a flexible plastic sheet, a microprocessor, a sensing circuit, a heat generating circuit, and a data transmitting circuit; the microprocessor being operably coupled to the sensing circuit, the heat generating circuit, and the data transmitting circuit; the microprocessor, the sensing circuit, the heat generating circuit, and the data transmitting circuit being disposed on and coupled to a first side of the flexible plastic sheet, the flexible plastic sheet further having an adhesive portion disposed on the first side on a peripheral region of the flexible plastic sheet, and adhesive portion adhering at least a portion of the first side of the flexible plastic sheet to an exterior surface of the housing of the pouch-type battery cell such that the microprocessor, the sensing circuit, and the heat generating circuit are disposed between the flexible plastic sheet and the exterior surface of the housing of the pouch-type battery cell;

the microprocessor being electrically coupled to the first and second electrical terminals of the pouch-type battery cell, the first and second electrical terminals supplying an operational voltage to the microprocessor;

the microprocessor being programmed to determine a first voltage value corresponding to an open circuit voltage of the pouch-type battery cell between the first and second electrical terminals;

the microprocessor being further programmed to determine a second voltage value corresponding to a first voltage of the pouch-type battery cell between the first and second electrical terminals when the pouch-type battery cell is supplying electrical current through the heat generating circuit;

the microprocessor being further programmed to determine a current value corresponding to an electrical current level flowing through the pouch-type battery cell when the pouch-type battery cell is supplying the electrical current through the heat generating circuit;

the microprocessor being further programmed to determine an internal resistance value corresponding to an internal resistance level of the pouch-type battery cell based on the first voltage value, the second voltage value, and the current value;

the microprocessor being further programmed to store the internal resistance value in a memory device; and the microprocessor being further programmed to generate a control signal to induce the data transmitting circuit to transmit a signal having a first binary message with a battery cell identifier value and the internal resistance value of the battery cell therein.

2. The battery cell assembly of claim 1, wherein:

the sensing circuit having a resistive trace having a resistance level that varies based on a temperature level of the pouch-type battery cell;

the sensing circuit configured to generate an output voltage that is indicative of a temperature value of the pouch-type battery cell, the temperature value indicating a temperature level of the pouch-type battery cell; and the microprocessor being further programmed to determine the temperature value of the pouch-type battery cell based on the output voltage.

3. The battery cell assembly of claim 2, wherein the resistive trace being disposed on the first side of the flexible plastic sheet.

4. The battery cell assembly of claim 2, wherein:

the microprocessor being further programmed to determine a state-of-charge value corresponding to a state-of-charge of the pouch-type battery cell based on the internal resistance value and the temperature value; and the microprocessor being further programmed to store the state-of-charge value in the memory device.

5. The battery cell assembly of claim 4, wherein the first binary message further includes the state-of-charge value of the pouch-type battery cell therein.

6. The battery cell assembly of claim 4, wherein the heat generating circuit further includes a heating element trace disposed on the flexible plastic sheet, the heating element trace being electrically coupled to the microprocessor.

7. The battery cell assembly of claim 6, wherein the microprocessor is further programmed to generate a control voltage to induce the heat generating circuit to supply electrical current to the heating element trace if the state-of-charge value of the pouch-type battery cell is greater than a state-of-charge threshold value.

8. The battery cell assembly of claim 7, wherein the microprocessor is further programmed to stop generating the control voltage to induce the heat generating circuit to stop supplying the electrical current to the heating element trace if the state-of-charge value of the pouch-type battery cell is less than or equal to the state-of-charge threshold value.

9. The battery cell assembly of claim 8, wherein the thin profile sensor further includes a data receiving circuit coupled to the flexible plastic sheet, the data receiving circuit configured to receive a signal having a second binary message therein from an external battery control module, and to output a voltage signal having the first binary message in response to the signal from the external battery control module, the second binary message indicating the state-of-charge threshold value, and the first binary message being received by the microprocessor.

10. The battery cell assembly of claim 1, wherein the microprocessor is coupled directly to the first side of the flexible plastic sheet.

11. The battery cell assembly of claim 1, wherein the microprocessor is coupled directly to a circuit board, the circuit board being coupled directly to the first side of the flexible plastic sheet.

12. The battery cell assembly of claim 1, wherein the housing of the pouch-type battery cell is a pouch-type housing.

13. A battery cell assembly, comprising:

a pouch-type battery cell having a pouch-type housing and first and second electrical terminals extending outwardly from the pouch-type housing;

a thin profile sensor having a flexible plastic sheet, a microprocessor, a sensing circuit, a heat generating circuit, and a data transmitting circuit; the microprocessor being operably coupled to the sensing circuit, the heat generating circuit, and the data transmitting circuit; the microprocessor, the sensing circuit, the heat generating circuit, and the data transmitting circuit being disposed on and coupled to the flexible plastic sheet, the flexible plastic sheet being disposed on and coupled to an exterior surface of the pouch-type housing of the pouch-type battery cell;

the sensing circuit having a resistive trace disposed directly on and coupled to the flexible plastic sheet, the resistive trace having at least first and second resistive trace portions spaced apart from one another, the sensing circuit generating a first voltage indicative of a temperature level of the pouch-type battery cell;

the heat generating circuit having a heating element trace being disposed directly on and coupled to the flexible plastic sheet, the heating element trace having at least first and second heating element trace portions spaced apart from one another, the first resistive trace portion being disposed between the first and second heating element trace portions on the flexible plastic sheet, the heating element trace being electrically coupled to the microprocessor;

the microprocessor being electrically coupled to the first and second electrical terminals of the pouch-type battery cell, the first and second electrical terminals supplying an operational voltage to the microprocessor;

the microprocessor being programmed to determine a first voltage value corresponding to an open circuit voltage of the pouch-type battery cell between the first and second electrical terminals;

the microprocessor being further programmed to determine a second voltage value corresponding to a first voltage of the pouch-type battery cell between the first and second electrical terminals when the pouch-type battery cell is supplying electrical current through the heat generating circuit;

the microprocessor being further programmed to determine a current value corresponding to an electrical current level flowing through the pouch-type battery cell when the pouch-type battery cell is supplying the electrical current through the heat generating circuit;

the microprocessor being further programmed to determine an internal resistance value corresponding to an internal resistance level of the pouch-type battery cell based on the first voltage value, the second voltage value, and the current value; and the microprocessor being further programmed to generate a control signal to induce the data transmitting circuit to transmit a signal having a first binary message with a battery cell identifier value and the internal resistance value of the pouch-type battery cell therein.

14. The battery cell assembly of claim 13, wherein the microprocessor utilizes the operational voltage to operate.

15. The battery cell assembly of claim 13, wherein the first and second heating element trace portions extending substantially parallel to the first and second resistive trace portions.

16. A battery cell assembly, comprising:

a battery cell having a housing and first and second electrical terminals extending outwardly from the housing;

a thin profile sensor having a flexible plastic sheet, a microprocessor, a sensing circuit, and a data transmitting circuit; the microprocessor being operably coupled to the sensing circuit and to the data transmitting circuit;

the flexible plastic sheet having a first side and a second side; the flexible plastic sheet further having an adhesive portion disposed on a peripheral region on the first side of the flexible plastic sheet, the adhesive portion adhering the first side of the flexible plastic sheet to the exterior surface of the housing of the battery cell;

the microprocessor, the sensing circuit, and the data transmitting circuit being coupled to the first side of the flexible plastic sheet such that the microprocessor, the sensing circuit, and the data transmitting circuit are disposed between the flexible plastic sheet and the exterior surface of the housing of the battery cell; the microprocessor, the sensing circuit, and the data transmitting circuit being further disposed within a region on the first side of the flexible plastic sheet that is peripherally surrounded by the adhesive portion;

the sensing circuit having a resistive trace disposed directly on and coupled to the first side of the flexible plastic sheet, the resistive trace having a resistance level that varies based on a temperature level of the battery cell, the sensing circuit generating a first voltage indicative of the temperature level of the battery cell;

the microprocessor being electrically coupled to the first and second electrical terminals of the battery cell, the first and second electrical terminals supplying an operational voltage to the microprocessor;

the microprocessor being programmed to determine a first voltage value corresponding to an open circuit voltage of the battery cell between the first and second electrical terminals;

the microprocessor being further programmed to determine a second voltage value corresponding to a first voltage of the battery cell between the first and second electrical terminals when the battery cell is supplying electrical current through the heat generating circuit;

the microprocessor being further programmed to determine a current value corresponding to an electrical current level flowing through the battery cell when the battery cell is supplying the electrical current through the heat generating circuit;

the microprocessor being further programmed to determine an internal resistance value corresponding to an internal resistance level of the battery cell based on the first voltage value, the second voltage value, and the current value; and the microprocessor being further programmed to generate a control signal to induce the data transmitting circuit to transmit a signal having a first binary message with a battery cell identifier value and the internal resistance value of the battery cell therein.

17. The battery cell assembly of claim 16, wherein the microprocessor utilizes the operational voltage to operate.

18. The battery cell assembly of claim 16, wherein the battery cell is a pouch-type battery cell and the housing is a pouch-type housing.

* * * * *